United States Patent
Wu et al.

(10) Patent No.: US 11,908,360 B2
(45) Date of Patent: Feb. 20, 2024

(54) CHARGE DETECTION CIRCUIT AND DETECTION METHOD THEREOF AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Sijia Wu, Shenzhen (CN); Xin Zhang, Shenzhen (CN); Jiangbo Yao, Shenzhen (CN); Haijun Wang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 232 days.

(21) Appl. No.: 17/440,741

(22) PCT Filed: Jun. 4, 2021

(86) PCT No.: PCT/CN2021/098385
§ 371 (c)(1),
(2) Date: Sep. 17, 2021

(87) PCT Pub. No.: WO2022/213471
PCT Pub. Date: Oct. 13, 2022

(65) Prior Publication Data
US 2023/0245604 A1      Aug. 3, 2023

(30) Foreign Application Priority Data
Apr. 8, 2021   (CN) .......................... 202110375378.X

(51) Int. Cl.
*G09G 3/00*      (2006.01)

(52) U.S. Cl.
CPC ......... *G09G 3/006* (2013.01); *G09G 2330/08* (2013.01); *G09G 2330/12* (2013.01)

(58) Field of Classification Search
CPC ....... G09G 3/36; G01J 2001/4473; G01J 1/46
See application file for complete search history.

(56) References Cited

U.S. PATENT DOCUMENTS 9,709,439 B2 * 7/2017 Goh .................. G06F 3/0412
2015/0356920 A1   12/2015 Na et al.

FOREIGN PATENT DOCUMENTS

| CN | 108646949 A | 10/2018 |
|---|---|---|
| CN | 109298804 A | 2/2019 |

(Continued)

OTHER PUBLICATIONS

International Search Report in International application No. PCT/CN2021/098385, dated Jan. 12, 2022.

(Continued)

*Primary Examiner* — Sardis F Azongha
(74) *Attorney, Agent, or Firm* — PV IP PC; Wei Te Chung; Zhigang Ma

(57) ABSTRACT

A charge detection circuit and a detection method thereof and a display panel are provided. A second storage capacitor is added to the charge detection circuit. The second storage capacitor can continuously accumulate the charge amount of a second thin film transistor. When a third thin film transistor is turned on, all the charges accumulated by the second storage capacitor flow into an integrator, so that second thin film transistor does not need to be operated in a linear region. Increasing the charge amount of the charge detection circuit is beneficial for the display panel to distinguish light sensor signals.

16 Claims, 2 Drawing Sheets

(56) References Cited

FOREIGN PATENT DOCUMENTS

| | | |
|---|---|---|
| CN | 110164362 A | 8/2019 |
| CN | 111179834 A | 5/2020 |
| CN | 112071277 A | 12/2020 |
| IN | 103077680 A | 5/2013 |
| WO | 2020232654 A1 | 11/2020 |

OTHER PUBLICATIONS

Written Opinion of the International Searching Authority in International application No. PCT/CN2021/098385, dated Jan. 12, 2022.
Chinese Office Action in corresponding Chinese Patent Application No. 202110375378.X dated Jan. 19, 2022, pp. 1-9.

\* cited by examiner

| 201 | In an initial stage, in a light environment, a first power signal is inputted to a gate electrode of a first thin film transistor, a second power signal is inputted to a drain electrode of the first thin film transistor, the first thin film transistor is turned on, and a photocurrent is generated, the photocurrent is outputted from a source electrode of the first thin film transistor to a first storage capacitor and a second thin film transistor, and a first leakage current outputted to the second thin film transistor correspondingly forms a turn-on voltage of a gate electrode of the second thin film transistor to turn on the second thin film transistor |

| 202 | in an photocurrent amplifying stage, a third power signal is inputted to a drain electrode of the second thin film transistor, the second thin film transistor generates a leakage current, the leakage current is outputted from a source electrode of the second thin film transistor to a second storage capacitor, and the second storage capacitor performs an integration operation on the leakage current to accumulate charges |

| 203 | In a photocurrent obtaining stage, a first control signal is inputted to a gate electrode of a third thin film transistor to turn on the third thin film transistor, and the charges stored in the second storage capacitor is outputted from a source electrode of the third thin film transistor to an integrator |

| 204 | In a reset phase, a second control signal is inputted to a gate electrode of the fourth thin film transistor to turn on the fourth thin film transistor, a fourth power signal is applied to a drain electrode of the fourth thin film transistor to pull down a voltage at the gate electrode of the second thin film transistor to turn off the second thin film transistor |

FIG. 3

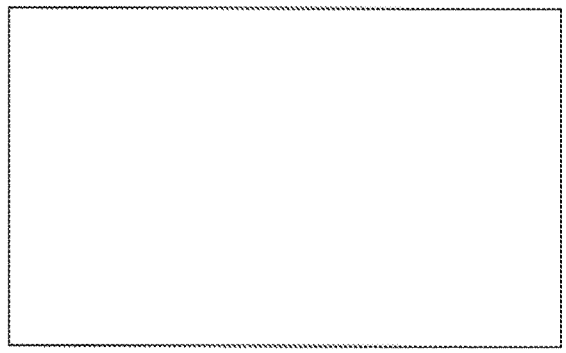

FIG. 4

CHARGE DETECTION CIRCUIT AND DETECTION METHOD THEREOF AND DISPLAY PANEL

RELATED APPLICATIONS

This application is a Notional Phase of PCT Patent Application No. PCT/CN2021/098385 having international filing date of Jun. 4, 2021, which claims the benefit of priority of Chinese Patent Application No. 202110375378.X filed on Apr. 8, 2021. The contents of the above applications are all incorporated by reference as if fully set forth herein in their entirety.

TECHNICAL FIELD

The present disclosure relates to the display technology field, and more particularly to a charge detection circuit and a detection method thereof and a display panel.

BACKGROUND ART

Currently, light sensing performance has a high added value for a display panel and can provide users with convenient and rich experiences. Detection of light sensing signals is a core part of a light sensor panel to realize a photosensitive function, and a 4T circuit with a function of detecting and amplifying the light sensor signals has unique advantages.

In an existing light sensor panel, a 4T1C charge detection circuit is generally configured to detect light signals. In the 4T1C charge detection circuit, a charge amount detected by an integrator is affected by turn-on time of a switching thin film transistor and a leakage current of an amplifying thin film transistor. The turn-on time of the switching thin film transistor is restricted by a frame rate and a number of rows of the display panel, and is generally only in a range of microseconds. The leakage current of the amplifying thin film transistor is restricted by electrical properties of the amplifying thin film transistor. For a most commonly used amorphous silicon thin film transistor, the charge amount detected by integrator can reach 10 or more picocoulombs only when the amorphous silicon thin film transistor is operated in a linear region. In practical use processes, a required range of the detected charge amount is often from 10 picocoulombs to 20 picocoulombs. This causes the amplifying thin film transistor to be operated in the linear region for a long time where a voltage difference between a gate electrode and a source electrode is very large, so that an electrical curve shifts toward a positive direction and device performance is deteriorating.

Therefore, avoiding a phenomenon that the electrical curve of the amplifying thin film transistor shifts toward the positive direction is a difficult problem that panel manufacturers need to work hard to overcome.

Technical Problem

Embodiments of the present disclosure provide a detection circuit and a detection method thereof and a display panel capable of solving the technical problem that an electrical curve of a conventional amplifying thin film transistor shifts toward a positive direction.

Technical Solution

One embodiment of the present disclosure provides a charge detection circuit, including:

a first thin film transistor, a second thin film transistor, a third thin film transistor, a fourth thin film transistor, a first storage capacitor, and a second storage capacitor;

a gate electrode of the first thin film transistor electrically connected to a first power signal, a drain electrode of the first thin film transistor electrically connected to a second power signal, and a source electrode of the first thin film transistor electrically connected to a first node;

a gate electrode of the second thin film transistor electrically connected to the first node, a drain electrode of the second thin film transistor electrically connected to a third power signal, and a source electrode of the second thin film transistor electrically connected to a second node;

a gate electrode of the third thin film transistor electrically connected to a first control signal, a drain electrode of the third thin film transistor electrically connected to the second node, and a source electrode of the third thin film transistor electrically connected to an input terminal of an integrator;

a gate electrode of the fourth thin film transistor electrically connected to a second control signal, a drain electrode of the fourth thin film transistor electrically connected to a fourth power signal, and a source electrode of the fourth thin film transistor electrically connected to the first node;

one terminal of the first storage capacitor electrically connected to the gate electrode of the first thin film transistor, and the other terminal of the first storage capacitor electrically connected to the first node; and one terminal of the second storage capacitor electrically connected to the drain electrode of the fourth thin film transistor, and the other terminal of the second storage capacitor electrically connected to the second node.

Optionally, in some embodiments of the present disclosure, a combination of the first power signal, the second power signal, the third power signal, the fourth power signal, the first control signal, and the second control signal sequentially corresponds to an initial stage, a photocurrent amplifying stage, a photocurrent obtaining stage, and a reset stage.

Optionally, in some embodiments of the present disclosure, the first power signal, the second power signal, the third power signal, and the fourth power signal are all fixed direct-current voltages, and amplitudes of the first power signal, the second power signal, the third power signal, and the fourth power signal are ranged from −10 volts to 20 volts.

Optionally, in some embodiments of the present disclosure, in the photocurrent obtaining stage, the first control signal is at a high voltage level, and the second control signal is at a low voltage level.

Optionally, in some embodiments of the present disclosure, in the reset stage, the first control signal is at a low voltage level, and the second control signal is at a high voltage level.

Optionally, in some embodiments of the present disclosure, in the initial stage and the photocurrent amplifying stage, the first control signal is at a low voltage level, and the second control signal is at a low voltage level.

Optionally, in some embodiments of the present disclosure, the first thin film transistor, the second thin film transistor, the third thin film transistor, and the fourth thin film transistor are all low temperature polysilicon thin film transistors, oxide semiconductor thin film transistors, or amorphous silicon thin film transistors.

Optionally, in some embodiments of the present disclosure, a difference value between a voltage at the gate electrode of the first thin film transistor and a voltage at the source electrode is ranged from 5 volts to 10 volts.

Correspondingly, one embodiment of the present disclosure further provides a detection method of a charge detection circuit. The detection method includes the following steps:

in an initial stage, in a light environment, a first power signal is inputted to a gate electrode of a first thin film transistor, a second power signal is inputted to a drain electrode of the first thin film transistor, the first thin film transistor is turned on, and a photocurrent is generated, the photocurrent is outputted from a source electrode of the first thin film transistor to a first storage capacitor and a second thin film transistor, and a first leakage current outputted to the second thin film transistor correspondingly forms a turn-on voltage of a gate electrode of the second thin film transistor to turn on the second thin film transistor;

in an photocurrent amplifying stage, a third power signal is inputted to a drain electrode of the second thin film transistor, the second thin film transistor generates a leakage current, the leakage current is outputted from a source electrode of the second thin film transistor to a second storage capacitor, and the second storage capacitor performs an integration operation on the leakage current to accumulate charges;

in a photocurrent obtaining stage, a first control signal is inputted to a gate electrode of a third thin film transistor to turn on the third thin film transistor, and the charges stored in the second storage capacitor is outputted from a source electrode of the third thin film transistor to an integrator; and in a reset phase, a second control signal is inputted to a gate electrode of the fourth thin film transistor to turn on the fourth thin film transistor, a fourth power signal is applied to a drain electrode of the fourth thin film transistor to pull down a voltage at the gate electrode of the second thin film transistor to turn off the second thin film transistor.

Optionally, in some embodiments of the present disclosure, the first thin film transistor is a photosensitive thin film transistor, and the first thin film transistor is configured to generate a photocurrent under light.

Correspondingly, one embodiment of the present disclosure further provides a display panel. The display panel includes a charge detection circuit. The charge detection circuit includes:

a first thin film transistor, a second thin film transistor, a third thin film transistor, a fourth thin film transistor, a first storage capacitor, and a second storage capacitor;

a gate electrode of the first thin film transistor electrically connected to a first power signal, a drain electrode of the first thin film transistor electrically connected to a second power signal, and a source electrode of the first thin film transistor electrically connected to a first node;

a gate electrode of the second thin film transistor electrically connected to the first node, a drain electrode of the second thin film transistor electrically connected to a third power signal, and a source electrode of the second thin film transistor electrically connected to a second node;

a gate electrode of the third thin film transistor electrically connected to a first control signal, a drain electrode of the third thin film transistor electrically connected to the second node, and a source electrode of the third thin film transistor electrically connected to an input terminal of an integrator;

a gate electrode of the fourth thin film transistor electrically connected to a second control signal, a drain electrode of the fourth thin film transistor electrically connected to a fourth power signal, and a source electrode of the fourth thin film transistor electrically connected to the first node;

one terminal of the first storage capacitor electrically connected to the gate electrode of the first thin film transistor, and the other terminal of the first storage capacitor electrically connected to the first node; and one terminal of the second storage capacitor electrically connected to the drain electrode of the fourth thin film transistor, and the other terminal of the second storage capacitor electrically connected to the second node.

Optionally, in some embodiments of the present disclosure, a combination of the first power signal, the second power signal, the third power signal, the fourth power signal, the first control signal, and the second control signal sequentially corresponds to an initial stage, a photocurrent amplifying stage, a photocurrent obtaining stage, and a reset stage.

Optionally, in some embodiments of the present disclosure, the first power signal, the second power signal, the third power signal, and the fourth power signal are all fixed direct-current voltages, and amplitudes of the first power signal, the second power signal, the third power signal, and the fourth power signal are ranged from −10 volts to 20 volts.

Optionally, in some embodiments of the present disclosure, in the photocurrent obtaining stage, the first control signal is at a high voltage level, and the second control signal is at a low voltage level.

Optionally, in some embodiments of the present disclosure, in the reset stage, the first control signal is at a low voltage level, and the second control signal is at a high voltage level.

Optionally, in some embodiments of the present disclosure, in the initial stage, the first control signal is at a low voltage level, and the second control signal is at a low voltage level.

Optionally, in some embodiments of the present disclosure, in the photocurrent amplifying stage, the first control signal is at a low voltage level, and the second control signal is at a low voltage level.

Optionally, in some embodiments of the present disclosure, the first thin film transistor, the second thin film transistor, the third thin film transistor, and the fourth thin film transistor are all low temperature polysilicon thin film transistors, oxide semiconductor thin film transistors, or amorphous silicon thin film transistors.

Optionally, in some embodiments of the present disclosure, a difference value between a voltage at the gate electrode of the first thin film transistor and a voltage at the source electrode is ranged from 5 volts to 10 volts.

Advantageous Effects

In the charge detection circuit and the detection method thereof and the display panel provided by the embodiments of the present disclosure, the second storage capacitor is added to the charge detection circuit. One terminal of the second storage capacitor is electrically connected to the drain electrode of the fourth thin film transistor, and the other terminal is electrically connected to the drain electrode of the third thin film transistor. As such, no matter whether the third thin film transistor is turned on or not, the second storage capacitor continuously accumulates the charge amount of the second thin film transistor. When the third thin film transistor is turned on, all the charges accumulated by the second storage capacitor flow into the integrator. Therefore, first, the time of accumulating the charges of the second storage capacitor is long enough, and the second thin film transistor does not need to be operated in a linear region where a voltage difference between the gate electrode and the source electrode, thereby avoiding the phenomenon that an electrical curve shifts toward a positive direction and increasing device performance Second, the charge amount of the charge detection circuit can be increased to increase the intensity of light sensor signals of the charge detection circuit. As such, an intensive ratio of a bright state to a dark state in the display is increased, and it is beneficial for the display panel to distinguish and process the light sensor signals.

BRIEF DESCRIPTION OF DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

FIG. 3 illustrates a flowchart of a detection method of a charge detection circuit provided by one embodiment of the present disclosure.

FIG. 4 illustrates a structural diagram of a display panel provided by one embodiment of the present disclosure.

DETAILED DESCRIPTION OF EMBODIMENTS

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure.

Thin film transistors in all the embodiments of the present disclosure can be replaced by adopting field-effect transistors or other devices with the same characteristics. Since source electrodes and drain electrodes of the thin film transistors used herein are symmetrical, the source electrodes and the drain electrodes can be interchangeable. In the embodiment of the present disclosure, in order to distinguish two electrodes of one thin film transistor except a gate electrode, one of the two electrodes is called as a source electrode and the other is called as a drain electrode. According to the type shown in FIG. 1, it is stipulated that a middle terminal of a switching thin film transistor is a gate electrode, a signal input terminal is a source electrode, and an output terminal is a drain electrode. Furthermore, the thin film transistors used in the embodiment of the present disclosure can include P-type thin film transistors and/or N-type thin film transistors. The P-type thin film transistors are turned on when the gate electrodes are at a low voltage level and are turned off when the gate electrodes are at a high voltage level. The N-type thin film transistors are turned on when the gate electrodes are at high low voltage level and are turned off when the gate electrodes are at a low voltage level.

One embodiment of the present disclosure provides a charge detection circuit and a detection method thereof and a display panel. Detailed descriptions are given below. It should be noted that a description order of the following embodiments is not intended to limit preference orders of the embodiments.

Figure 1:
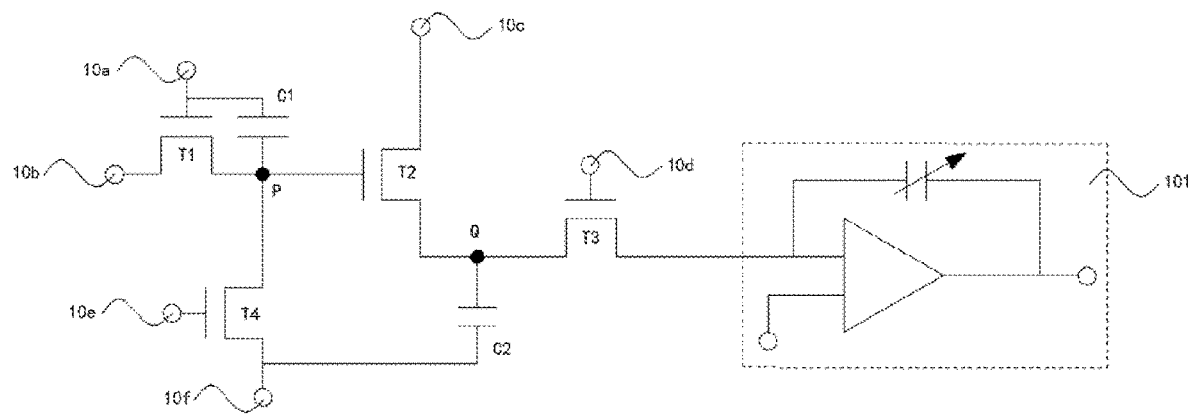
FIG. 1 illustrates a structural diagram of a charge detection circuit provided by one embodiment of the present disclosure.

Specifically, please refer to FIG. 1, which illustrates a structural diagram of a charge detection circuit provided by one embodiment of the present disclosure. The charge detection circuit provided by the embodiment of the present disclosure includes: a first thin film transistor T1, a second thin film transistor T2, a third thin film transistor T3, a fourth thin film transistor T4, a first storage capacitor C1, and a second storage capacitor C2.

It should be noted that a gate electrode of the first thin film transistor T1 is electrically connected to a first power signal 10a, a drain electrode of the first thin film transistor T1 is electrically connected to a second power signal 10b, and a source electrode of the first thin film transistor T1 is electrically connected to a first node P. A gate electrode of the second thin film transistor T2 is electrically connected to the first node P, a drain electrode of the second thin film transistor T2 is electrically connected to a third power signal 10c, and a source electrode of the second thin film transistor T2 is electrically connected to a second node Q. A gate electrode of the third thin film transistor T3 is electrically connected to a first control signal 10d, a drain electrode of the third thin film transistor T3 is electrically connected to the second node Q, and a source electrode of the third thin film transistor T3 is electrically connected to an input terminal of an integrator 101. A gate electrode of the fourth thin film transistor T4 is electrically connected to a second control signal 10e, a drain electrode of the fourth thin film transistor T4 is electrically connected to a fourth power signal 10f, and a source electrode of the fourth thin film transistor T4 is electrically connected to the first node P. One terminal of the first storage capacitor C1 is electrically connected to the gate electrode of the first thin film transistor T1, and the other terminal of the first storage capacitor C1 is electrically connected to the first node P. One terminal of the second storage capacitor C2 is electrically connected to the drain electrode of the fourth thin film transistor T4, and the other terminal of the second storage capacitor C2 is electrically connected to the second node Q.

It should be noted that the first thin film transistor T1 is a photosensitive thin film transistor, and the photosensitive thin film transistor can convert an optical signal into an electrical signal. Accordingly, the first thin film transistor T1 can generate a photocurrent under light.

A difference value between a voltage at the gate electrode of the first thin film transistor T1 and a voltage at the source electrode is ranged from 5 volts to 10 volts. Specifically, the difference value between the voltage at the gate electrode of the first thin film transistor T1 and the voltage at the source electrode is 5 volts, 5.5 volts, 6 volts, 7 volts, 8 volts, or 10 volts. The difference value between the voltage at the gate electrode of the first thin film transistor T1 and the voltage at the source electrode is determined by specific requirements of the charge detection circuit.

It should be noted that ensuring the difference value between the voltage at the gate electrode of the first thin film transistor T1 and the voltage at the source electrode to be ranged from 5 volts to 10 volts can control a difference between a leakage current of the first thin film transistor T1 in a bright state and a leakage current in a dark state as large as possible.

It should be noted that the second thin film transistor T2 is mainly configured to amplify the photocurrent.

It should be noted that the third thin film transistor T3 is mainly configured to control a read timing of the photocurrent.

It should be noted that the fourth thin film transistor T4 is mainly configured to reset the photocurrent.

In some embodiments, the first thin film transistor T1, the second thin film transistor T2, the third thin film transistor T3, and the fourth thin film transistor T4 are all low temperature polysilicon thin film transistors, oxide semiconductor thin film transistors, or amorphous silicon thin film transistors. The thin film transistors in the charge detection circuit provided by the embodiment of the present disclosure are the same type of thin film transistors, so as to avoid the influence of the difference of different types of thin film transistors on the charge detection circuit.

Figure 2:
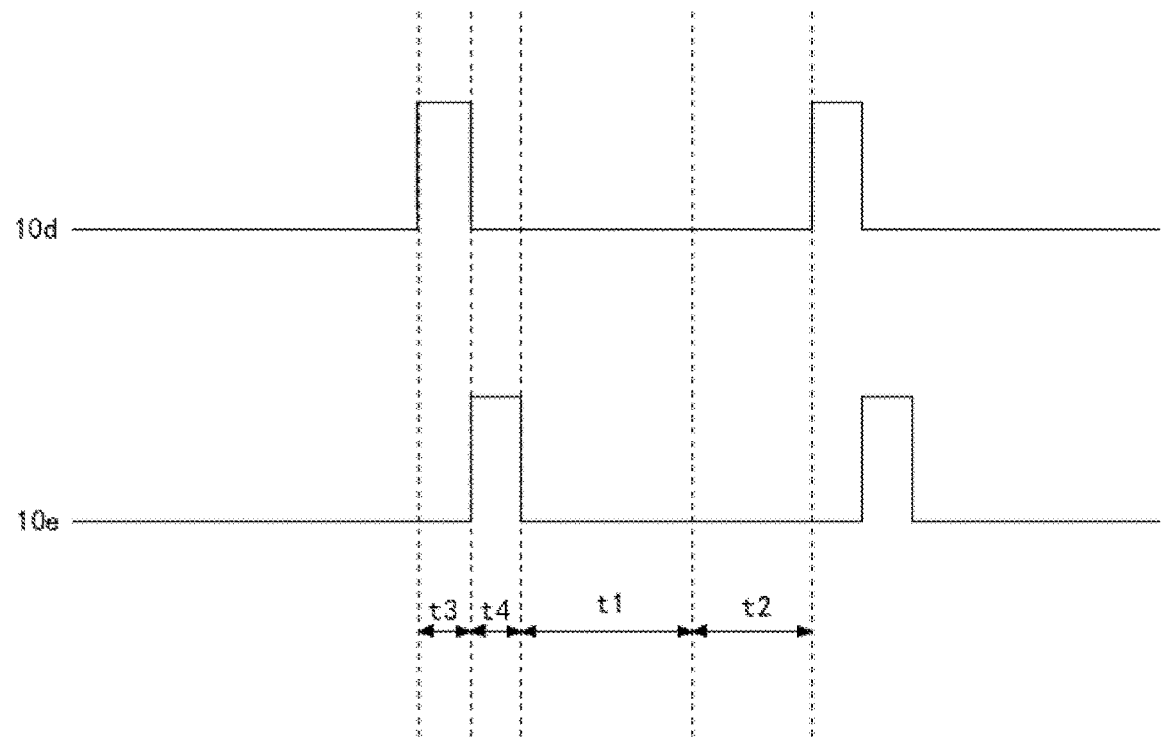
FIG. 2 illustrates a timing diagram of the charge detection circuit provided by one embodiment of the present disclosure.

Please refer to FIG. 2. FIG. 2 illustrates a timing diagram of the charge detection circuit provided by one embodiment of the present disclosure. As shown in the timing diagram of the charge detection circuit provided by the embodiment of the present disclosure, a combination of the first power signal 10a, the second power signal 10b, the third power signal 10c, the fourth power signal 10f, the first control signal 10d, and the second control signal 10e sequentially corresponds to an initial stage t1, a photocurrent amplifying stage t2, a photocurrent obtaining stage t3, and a reset stage t4.

In some embodiments, in the initial stage t1, the first control signal 10d is at a low voltage level, and the second control signal 10e is at a low voltage level.

In some embodiments, in the photocurrent amplifying stage t2, the first control signal 10d is at the low voltage level, and the second control signal 10e is at the low voltage level.

In some embodiments, in the photocurrent obtaining stage t3, the first control signal 10d is at a high voltage level, and the second control signal 10e is at the low voltage level.

In some embodiments, in the reset stage t4, the first control signal 10d is at the low voltage level, and the second control signal 10e is at a high voltage level.

Further, the first power signal 10a, the second power signal 10b, the third power signal 10c, and the fourth power signal 10f are all fixed direct-current voltages, and amplitudes of the first power signal 10a, the second power signal 10b, the third power signal 10c, and the fourth power signal 10f are ranged from −10 volts to 20 volts.

Specifically, the amplitude of the first power signal 10a is −10 volts, −8 volts, −6 volts, −2 volts, 2 volts, 8 volts, 14 volts, or 20 volts. The amplitude of the second power signal 10b is −10 volts, −8 volts, −6 volts, −2 volts, 2 volts, 8 volts, 14 volts, or 20 volts. The amplitude of the third power signal 10c is −10 volts, −8 volts, −6 volts, −2 volts, 2 volts, 8 volts, 14 volts, or 20 volts. The amplitude of the fourth power signal 10f is −10 volts, −8 volts, −6 volts, −2 volts, 2 volts, 8 volts, 14 volts, or 20 volts. The specific amplitudes of the first power signal 10a, the second power signal 10b, the third power signal 10c, and the fourth power signal 10f are determined by specific requirements of the charge detection circuit.

In the charge detection circuit provided by the present disclosure, the second storage capacitor is added to the charge detection circuit. One terminal of the second storage capacitor is electrically connected to the drain electrode of the fourth thin film transistor, and the other terminal is electrically connected to the drain electrode of the third thin film transistor. As such, no matter whether the third thin film transistor is turned on or not, the second storage capacitor continuously accumulates the charge amount of the second thin film transistor. When the third thin film transistor is turned on, all the charges accumulated by the second storage capacitor flow into the integrator. Therefore, first, the time of accumulating the charges of the second storage capacitor is long enough, and the second thin film transistor does not need to be operated in a linear region where a voltage difference between the gate electrode and the source electrode, thereby avoiding the phenomenon that an electrical curve shifts toward a positive direction and increasing device performance. Second, the charge amount of the charge detection circuit can be increased to increase the intensity of light sensor signals of the charge detection circuit. As such, an intensive ratio of a bright state to a dark state in the display is increased, and it is beneficial for the display panel to distinguish and process the light sensor signals.

Please refer to FIG. 3. FIG. 3 illustrates a flowchart of a detection method of a charge detection circuit provided by one embodiment of the present disclosure. The detection method of the charge detection circuit provided by the embodiment of the present disclosure includes the following steps.

In step 201, in an initial stage, in a light environment, a first power signal is inputted to a gate electrode of a first thin film transistor, a second power signal is inputted to a drain electrode of the first thin film transistor, the first thin film transistor is turned on, and a photocurrent is generated, the photocurrent is outputted from a source electrode of the first thin film transistor to a first storage capacitor and a second thin film transistor, and a first leakage current outputted to the second thin film transistor correspondingly forms a turn-on voltage of a gate electrode of the second thin film transistor to turn on the second thin film transistor.

In step 202, in an photocurrent amplifying stage, a third power signal is inputted to a drain electrode of the second thin film transistor, the second thin film transistor generates a leakage current, the leakage current is outputted from a source electrode of the second thin film transistor to a second storage capacitor, and the second storage capacitor performs an integration operation on the leakage current to accumulate charges.

The leakage current is an amplified current of the photocurrent.

In step 203, in a photocurrent obtaining stage, a first control signal is inputted to a gate electrode of a third thin film transistor to turn on the third thin film transistor, and the charges stored in the second storage capacitor is outputted from a source electrode of the third thin film transistor to an integrator.

In step 204, in a reset phase, a second control signal is inputted to a gate electrode of the fourth thin film transistor to turn on the fourth thin film transistor, a fourth power signal is applied to a drain electrode of the fourth thin film transistor to pull down a voltage at the gate electrode of the second thin film transistor to turn off the second thin film transistor.

In the detection method of the charge detection circuit provided by the embodiment of the present disclosure, the second storage capacitor is added to the charge detection circuit. One terminal of the second storage capacitor is electrically connected to the drain electrode of the fourth thin film transistor, and the other terminal is electrically connected to the drain electrode of the third thin film transistor. As such, no matter whether the third thin film transistor is turned on or not, the second storage capacitor continuously accumulates the charge amount of the second thin film transistor. When the third thin film transistor is turned on, all the charges accumulated by the second storage capacitor flow into the integrator. Therefore, first, the time of accumulating the charges of the second storage capacitor is long enough, and the second thin film transistor does not need to be operated in a linear region where a voltage difference between the gate electrode and the source electrode, thereby avoiding the phenomenon that an electrical curve shifts toward a positive direction and increasing device performance. Second, the charge amount of the charge detection circuit can be increased to increase the intensity of light sensor signals of the charge detection circuit. As such, an intensive ratio of a bright state to a dark state in the display is increased, and it is beneficial for the display panel to distinguish and process the light sensor signals.

Please refer to FIG. 4. FIG. 4 illustrates a structural diagram of a display panel 100 provided by one embodiment of the present disclosure. The display panel 100 provided by the embodiment of the present disclosure includes the above-mentioned charge detection circuit. Detail descriptions can be referred to the descriptions of the above-mentioned charge detection circuit and are not repeated herein.

In the display panel provided by the embodiment of the present disclosure, the second storage capacitor is added to the charge detection circuit. One terminal of the second storage capacitor is electrically connected to the drain electrode of the fourth thin film transistor, and the other terminal is electrically connected to the drain electrode of the third thin film transistor. As such, no matter whether the third thin film transistor is turned on or not, the second storage capacitor continuously accumulates the charge amount of the second thin film transistor. When the third thin film transistor is turned on, all the charges accumulated by the second storage capacitor flow into the integrator. Therefore, first, the time of accumulating the charges of the second storage capacitor is long enough, and the second thin film transistor does not need to be operated in a linear region where a voltage difference between the gate electrode and the source electrode, thereby avoiding the phenomenon that an electrical curve shifts toward a positive direction and increasing device performance. Second, the charge amount of the charge detection circuit can be increased to increase the intensity of light sensor signals of the charge detection circuit. As such, an intensive ratio of a bright state to a dark state in the display is increased, and it is beneficial for the display panel to distinguish and process the light sensor signals.

In the above-mentioned embodiments, descriptions for the embodiments emphasize different aspects, and for a part without being described in detail in a certain embodiment, reference may be made to related descriptions in other embodiments.

The charge detection circuit and the detection method thereof and the display panel provided by the embodiments of the present disclosure are described in detail above. Specific examples are used in the specification to explain the principles and implementation manners of the present disclosure. The descriptions of the above-mentioned embodiments are only used to facilitate understanding of the technical solutions and core ideas of the present disclosure.

Those skilled in the art should understand that they may still make modifications to the technical solutions described in the above-mentioned embodiments or make equivalent replacements to some technical features thereof. These modifications or equivalent replacements do not depart from the spirit and scope of the technical solutions of the embodiments of the present disclosure.

What is claimed is:

1. A charge detection circuit, comprising: a first thin film transistor, a second thin film transistor, a third thin film transistor, a fourth thin film transistor, a first storage capacitor, and a second storage capacitor;
   a gate electrode of the first thin film transistor electrically connected to a first power signal, a drain electrode of the first thin film transistor electrically connected to a second power signal, and a source electrode of the first thin film transistor electrically connected to a first node;
   a gate electrode of the second thin film transistor electrically connected to the first node, a drain electrode of the second thin film transistor electrically connected to a third power signal, and a source electrode of the second thin film transistor electrically connected to a second node;
   a gate electrode of the third thin film transistor electrically connected to a first control signal, a drain electrode of the third thin film transistor electrically connected to the second node, and a source electrode of the third thin film transistor electrically connected to an input terminal of an integrator;
   a gate electrode of the fourth thin film transistor electrically connected to a second control signal, a drain electrode of the fourth thin film transistor electrically connected to a fourth power signal, and a source electrode of the fourth thin film transistor electrically connected to the first node;
   one terminal of the first storage capacitor electrically connected to the gate electrode of the first thin film transistor, and the other terminal of the first storage capacitor electrically connected to the first node; and
   one terminal of the second storage capacitor electrically connected to the drain electrode of the fourth thin film transistor, and the other terminal of the second storage capacitor electrically connected to the second node,
   wherein a difference value between a voltage at the gate electrode of the first thin film transistor and a voltage at the source electrode is ranged from 5 volts to 10 volts.

2. The charge detection circuit of claim 1, wherein a combination of the first power signal, the second power signal, the third power signal, the fourth power signal, the first control signal, and the second control signal sequentially corresponds to an initial stage, a photocurrent amplifying stage, a photocurrent obtaining stage, and a reset stage.

3. The charge detection circuit of claim 2, wherein the first power signal, the second power signal, the third power signal, and the fourth power signal are all fixed direct-current voltages, and amplitudes of the first power signal, the second power signal, the third power signal, and the fourth power signal are ranged from −10 volts to 20 volts.

4. The charge detection circuit of claim 2, wherein in the photocurrent obtaining stage, the first control signal is at a high voltage level, and the second control signal is at a low voltage level.

5. The charge detection circuit of claim 2, wherein in the reset stage, the first control signal is at a low voltage level, and the second control signal is at a high voltage level.

6. The charge detection circuit of claim 2, wherein in the initial stage, the first control signal is at a low voltage level, and the second control signal is at a low voltage level.

7. The charge detection circuit of claim 2, wherein in the photocurrent amplifying stage, the first control signal is at a low voltage level, and the second control signal is at a low voltage level.

8. The charge detection circuit of claim 1, wherein the first thin film transistor, the second thin film transistor, the third thin film transistor, and the fourth thin film transistor are all low temperature polysilicon thin film transistors, oxide semiconductor thin film transistors, or amorphous silicon thin film transistors.

9. A display panel, comprising a charge detection circuit, the charge detection circuit comprising: a first thin film transistor, a second thin film transistor, a third thin film transistor, a fourth thin film transistor, a first storage capacitor, and a second storage capacitor;

a gate electrode of the first thin film transistor electrically connected to a first power signal, a drain electrode of the first thin film transistor electrically connected to a second power signal, and a source electrode of the first thin film transistor electrically connected to a first node;

a gate electrode of the second thin film transistor electrically connected to the first node, a drain electrode of the second thin film transistor electrically connected to a third power signal, and a source electrode of the second thin film transistor electrically connected to a second node;

a gate electrode of the third thin film transistor electrically connected to a first control signal, a drain electrode of the third thin film transistor electrically connected to the second node, and a source electrode of the third thin film transistor electrically connected to an input terminal of an integrator;

a gate electrode of the fourth thin film transistor electrically connected to a second control signal, a drain electrode of the fourth thin film transistor electrically connected to a fourth power signal, and a source electrode of the fourth thin film transistor electrically connected to the first node;

one terminal of the first storage capacitor electrically connected to the gate electrode of the first thin film transistor, and the other terminal of the first storage capacitor electrically connected to the first node; and one terminal of the second storage capacitor electrically connected to the drain electrode of the fourth thin film transistor, and the other terminal of the second storage capacitor electrically connected to the second node, wherein a difference value between a voltage at the gate electrode of the first thin film transistor and a voltage at the source electrode is ranged from 5 volts to 10 volts.

10. The display panel of claim 9, wherein a combination of the first power signal, the second power signal, the third power signal, the fourth power signal, the first control signal, and the second control signal sequentially corresponds to an initial stage, a photocurrent amplifying stage, a photocurrent obtaining stage, and a reset stage.

11. The display panel of claim 10, wherein the first power signal, the second power signal, the third power signal, and the fourth power signal are all fixed direct-current voltages, and amplitudes of the first power signal, the second power signal, the third power signal, and the fourth power signal are ranged from −10 volts to 20 volts.

12. The display panel of claim 10, wherein in the photocurrent obtaining stage, the first control signal is at a high voltage level, and the second control signal is at a low voltage level.

13. The display panel of claim 10, wherein in the reset stage, the first control signal is at a low voltage level, and the second control signal is at a high voltage level.

14. The display panel of claim 10, wherein in the initial stage, the first control signal is at a low voltage level, and the second control signal is at a low voltage level.

15. The display panel of claim 10, wherein in the photocurrent amplifying stage, the first control signal is at a low voltage level, and the second control signal is at a low voltage level.

16. The display panel of claim 9, wherein the first thin film transistor, the second thin film transistor, the third thin film transistor, and the fourth thin film transistor are all low temperature polysilicon thin film transistors, oxide semiconductor thin film transistors, or amorphous silicon thin film transistors.

* * * * *